(12) United States Patent
Scheuerlein et al.

(10) Patent No.: US 8,149,607 B2
(45) Date of Patent: Apr. 3, 2012

(54) REWRITABLE MEMORY DEVICE WITH MULTI-LEVEL, WRITE-ONCE MEMORY CELLS

(75) Inventors: Roy E. Scheuerlein, Cupertino, CA (US); Luca Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 310 days.

(21) Appl. No.: 12/643,561

(22) Filed: Dec. 21, 2009

(65) Prior Publication Data

US 2011/0149631 A1    Jun. 23, 2011

(51) Int. Cl.
*G11C 17/00*    (2006.01)

(52) U.S. Cl. ............... 365/100; 365/185.01; 365/185.03; 365/185.25

(58) Field of Classification Search .................. 365/100, 365/189.01, 185.03, 185.25
See application file for complete search history.

(56) References Cited

U.S. PATENT DOCUMENTS

| | | | |
|---|---|---|---|
| 6,456,528 B1 * | 9/2002 | Chen .................... | 365/185.03 |
| 6,490,218 B1 | 12/2002 | Vyvoda et al. | |
| 6,901,549 B2 | 5/2005 | March et al. | |
| 6,996,004 B1 * | 2/2006 | Fastow et al. ............ | 365/185.03 |
| 7,051,251 B2 | 5/2006 | Moore et al. | |
| 7,062,602 B1 | 6/2006 | Moore et al. | |
| 7,177,183 B2 | 2/2007 | Scheuerlein et al. | |
| 7,447,056 B2 | 11/2008 | Scheuerlein et al. | |
| 7,450,414 B2 | 11/2008 | Scheuerlein | |
| 7,486,537 B2 | 2/2009 | Scheuerlein et al. | |
| 7,924,624 B2 * | 4/2011 | Kim et al. ................ | 365/185.22 |
| 2005/0086440 A1 | 4/2005 | Chan et al. | |
| 2005/0259495 A1 | 11/2005 | Chung | |
| 2006/0067117 A1 | 3/2006 | Petti | |
| 2006/0073642 A1 | 4/2006 | Yeh et al. | |
| 2007/0002603 A1 | 1/2007 | Cleeves | |

(Continued)

FOREIGN PATENT DOCUMENTS

EP    1 503 384    2/2005

(Continued)

OTHER PUBLICATIONS

International Search Report and Written Opinion for PCT/US2010/055547, dated Jan. 25, 2011, 12 pages.

*Primary Examiner* — Connie Yoha
(74) *Attorney, Agent, or Firm* — Brinks Hofer Gilson & Lione (57) ABSTRACT

The embodiments described herein are directed to a memory device with multi-level, write-once memory cells. In one embodiment, a memory device has a memory array comprising a plurality of multi-level write-once memory cells, wherein each memory cell is programmable to one of a plurality of resistivity levels. The memory device also contains circuitry configured to select a group of memory cells from the memory array, and read a set of flag bits associated with the group of memory cells. The set of flag bits indicate a number of times the group of memory cells has been written to. The circuitry is also configured to select a threshold read level appropriate for the number of times the group of memory cells has been written to, and for each memory cell in the group, read the memory cell as an unprogrammed single-bit memory cell or as a programmed single-bit memory cell based on the selected threshold read level.

14 Claims, 7 Drawing Sheets

U.S. PATENT DOCUMENTS

| | | |
|---|---|---|
| 2007/0002613 A1 | 1/2007 | Rahman et al. |
| 2007/0090425 A1 | 4/2007 | Kumar et al. |
| 2008/0144353 A1 | 6/2008 | Lung |
| 2009/0003158 A1 * | 1/2009 | Yang et al. ............ 369/47.15 |
| 2009/0085153 A1 | 4/2009 | Maxwell et al. |
| 2009/0086521 A1 | 4/2009 | Herner et al. |

FOREIGN PATENT DOCUMENTS

| | | |
|---|---|---|
| WO | WO 97/12368 | 4/1997 |
| WO | WO 2007/038709 | 4/2007 |

* cited by examiner

REWRITABLE MEMORY DEVICE WITH MULTI-LEVEL, WRITE-ONCE MEMORY CELLS

BACKGROUND

A typical write-once memory cell is manufactured in an original, un-programmed state and can later be programmed to a programmed state. A write-once memory cell is "write-once" in the sense that once the memory cell is programmed, the memory cell cannot be returned to its initial, un-programmed state. While write-once memory cells offer a low-cost storage solution as compared to re-writable memory cells, there are many applications in which rewritable storage is desired. Previous approaches to address this issue include using controller logic to point to un-programmed memory cells to simulate re-writability. See, for example, U.S. Pat. Nos. 7,051,251 and 7,062,602. However, the cost of providing twice the number of memory cells to simulate re-writability may reduce the cost advantage associated with write-once memory cells. U.S. Pat. No. 7,177,183 describes an alternative approach, in which a group of write-once memory cells are used to represent a single bit of data. To "rewrite" the data, an additional memory cell in the group is programmed. As with the other approach, this approach comes at the cost of requiring additional memory cells.

Recently, write-once memory cells have been disclosed that can be used to store two or more bits of data and have "one-time re-writability." For example, U.S. Patent Application Publication No. 2007/0090425 describes a write-once memory cell that can store more than two states by lowering the resistance of the memory cell through application of an appropriate programming pulse. Each lowered-resistance state corresponds to a different programmed state, and the memory cell is used as a multi-level cell ("MLC") to store two or more bits of data. If the appropriate programming pulse is applied, the resistance of the memory cell can be changed from a lowered-resistance state to a permanent, higher-resistance state. Accordingly, such memory cell can be considered to have "one-time re-writability" in that it can be written once to store two or more bits of data (with the memory cell acting as a MLC) and later to permanently set the memory cell to a higher resistance to represent a different state. Because this higher-resistance state is permanent, the memory cell can only be "rewritten" once, which limits the applicability of such memory cells for rewritable environments.

SUMMARY

Embodiments of the present invention are defined by the claims, and nothing in this section should be taken as a limitation on those claims.

By way of introduction, the embodiments described below are directed to a memory device with multi-level, write-once memory cells. In one embodiment, a memory device has a memory array comprising a plurality of multi-level write-once memory cells, wherein each memory cell is programmable to one of a plurality of resistivity levels. The memory device also contains circuitry configured to select a group of memory cells from the memory array, and read a set of flag bits associated with the group of memory cells. The set of flag bits indicate a number of times the group of memory cells has been written to. The circuitry is also configured to select a threshold read level appropriate for the number of times the group of memory cells has been written to, and for each memory cell in the group, read the memory cell as an unprogrammed single-bit memory cell or as a programmed single-bit memory cell based on the selected threshold read level.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

Figure 1:
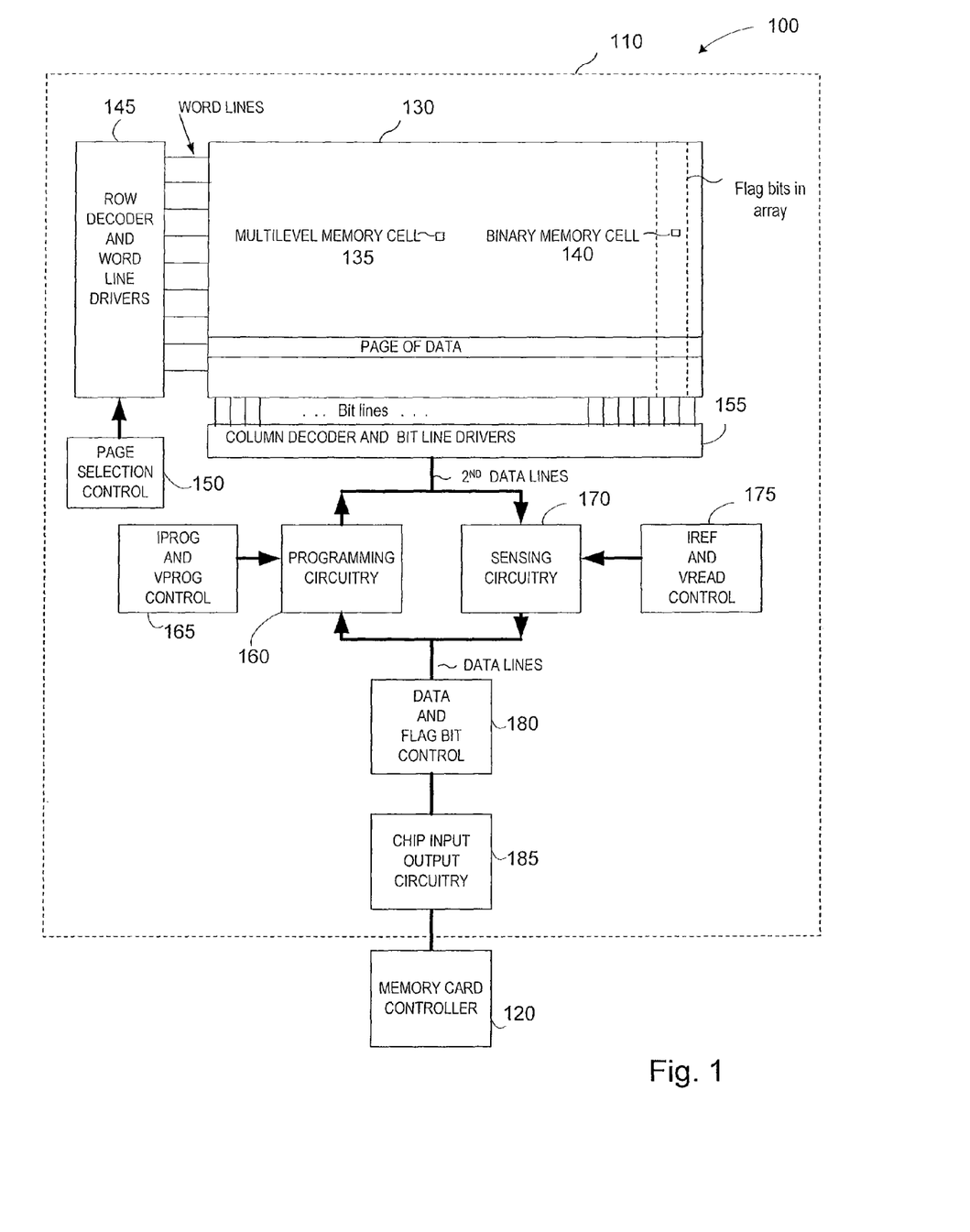
FIG. 1 is a block diagram of a memory device of an embodiment.

Turning now to the drawings, FIG. 1 is a block diagram of a memory device 100 of an embodiment. The memory device 100 can take any suitable form, such as, but not limited to, a handheld memory card that is removably connectable to a host, an embedded memory card (e.g., a secure module embedded in a host), a universal serial bus (USB) device, or a removable or non-removable hard drive, such as a solid-state drive. As shown in FIG. 1, the memory device 100 comprises a memory chip 110 and a controller 120. The memory chip 110 contains a memory array 130 comprising a plurality of multi-level write-once memory cells 135. Each memory cell is programmable to one of a plurality of resistivity levels. Memory cells that are only programmed once to one of two states will be referred to herein as a binary memory cell 140. The use of these memory cells will be described in more detail below.

The memory chip 110 also contains a row decoder and word line drivers 145 controlled by page selection control circuitry 150, as well as a column decoder and bit line drivers 155. Programming circuitry 160 (under the control of a Iprog and Vprog control circuitry 165) is used to program data into the memory array 130, and sensing circuitry 170 (under the control of Iref and Vread control circuitry 175) is used to read data from the memory array 130. The memory chip 110 also contains chip input-output circuitry 185 that interfaces with the controller 120, which controls general operations of the memory chip 110 and other functionality, such as, but not limited to, wear-leveling. The controller 120 also communicates with an interface (not shown) to receive read, program, and other commands from a host device (e.g., a personal computer, a portable media player, a mobile phone, a game device, etc.).

The function of the elements listed thus far is similar to those in a typical memory chip. However, the memory chip 110 of this embodiment contains data and flag bit control circuitry 180, which is used to implement the "re-writability" features discussed below. As used herein, "circuitry" can take the form of one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. It should be understood that "circuitry" recited in the claims can include some or all of the circuitry elements shown in FIG. 1, as well as additional elements not shown in FIG. 1.

As mentioned above, the memory array 130 comprising a plurality of multi-level write-once memory cells, where each memory cell is programmable to one of a plurality of resistivity levels. Some prior memory devices take advantage of this ability to program a memory cell with two or more bits of data if four or more levels are available. Because this type of memory cell is "write once," once a memory cell is programmed to a particular resistivity level, that resistivity level cannot be "un-programmed." However, the memory cell is "one-time re-writable" in the sense that after the memory cell is used to store two or more bits of data, the memory cell can later be set to a yet higher resistance to represent a different state.

Figure 2A:
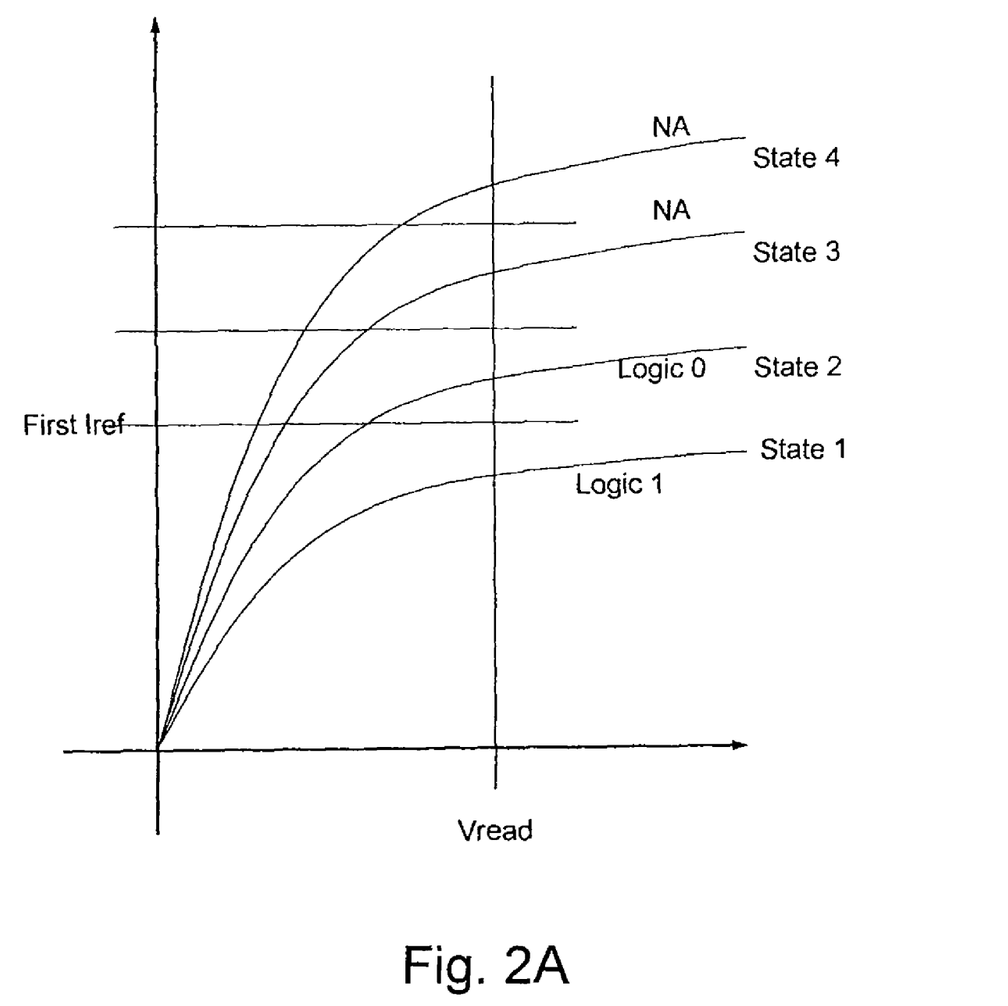
FIGS. 2A-2D are graphs of current versus voltage curves of a memory cell of an embodiment.
Figure 2B:
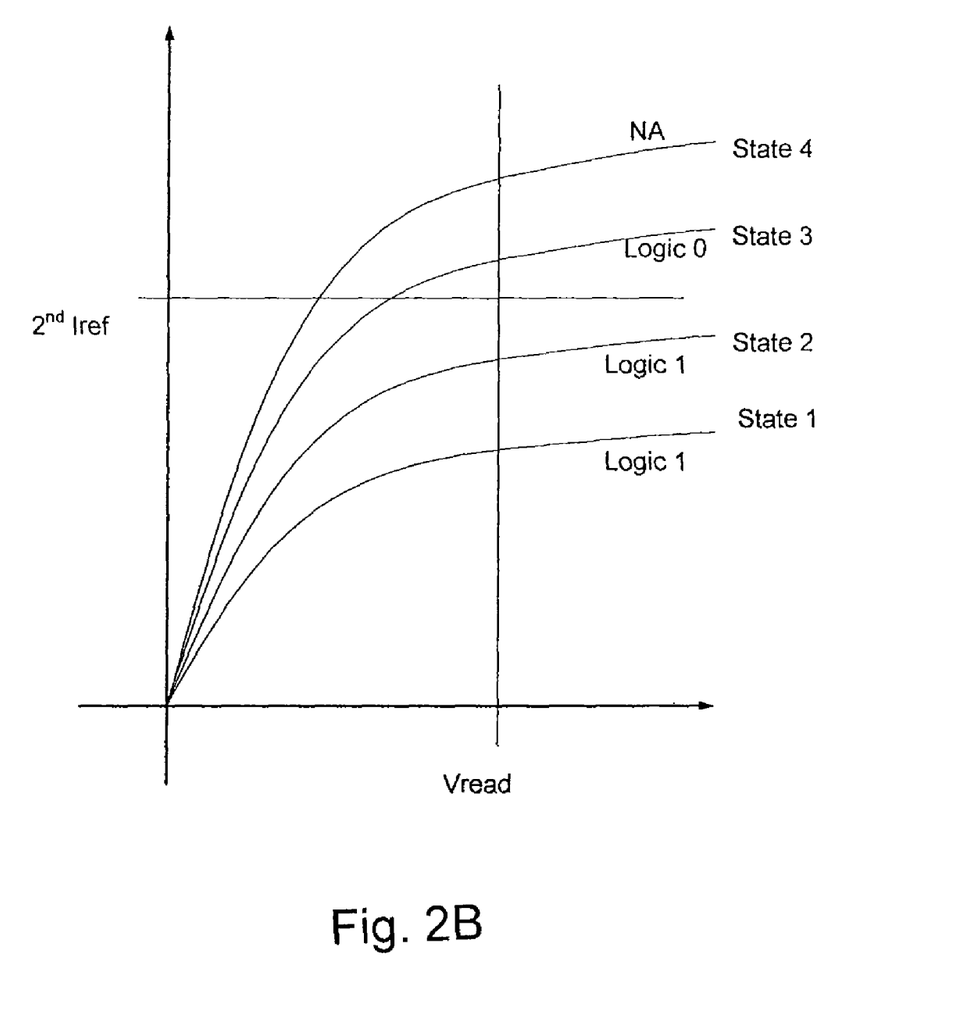
Figure 2C:
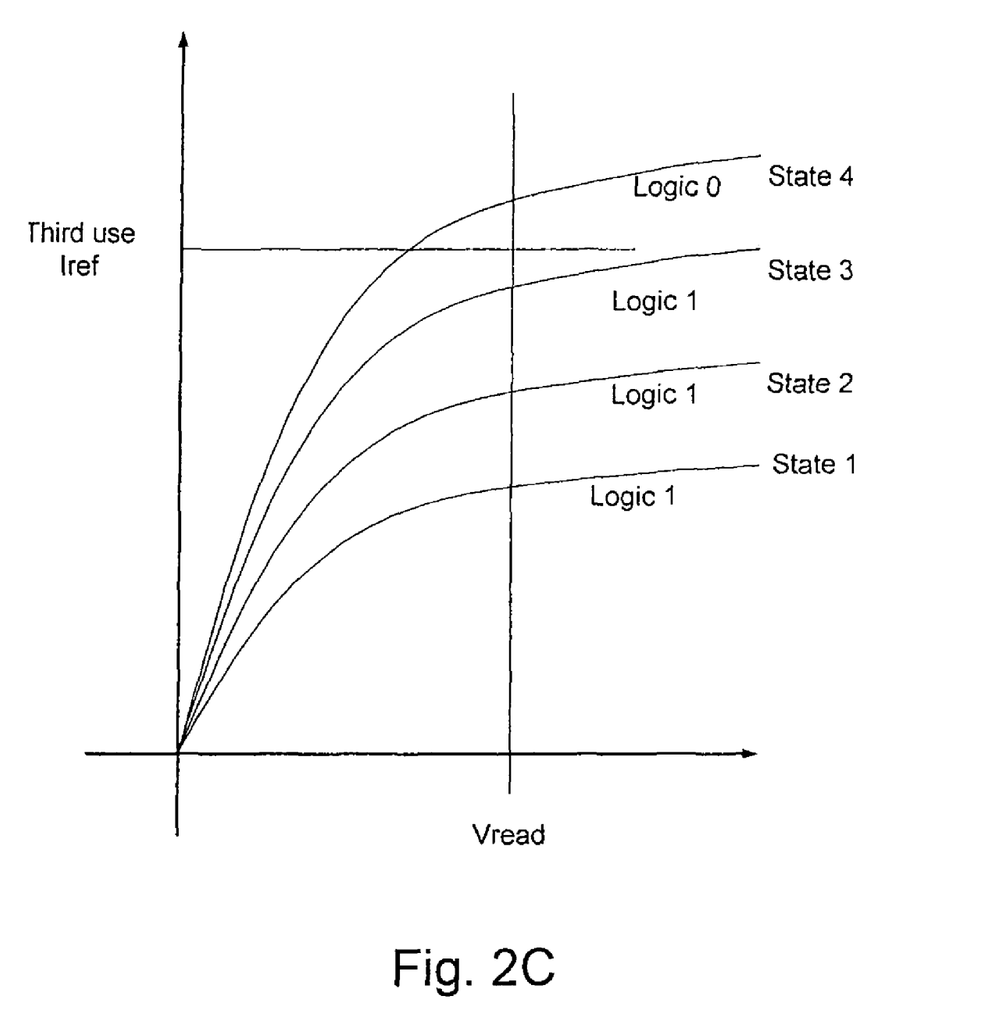

In the memory device 100 of these embodiments, instead of using the memory cell to store two or more bits of data, the memory device 100 takes advantage of the multi-level nature of the memory cell to store a single bit of data multiple times. This provides a "many-time re-writable" single-bit memory cell, even though the memory cell itself is "write once." The graphs in FIGS. 2A-2C illustrate this ability. Each of these graphs show current (I) versus voltage (V) curves of the four resistivity levels (states) of a memory cell. As illustrated by these graphs, choosing the appropriate Iref threshold for a given Vread allows one to distinguish between different states, and by adjusting the Iref threshold, one can distinguish between different sets of two states. For example, the first Iref in FIG. 2A can distinguish between State 1 and State 2, the second Iref in FIG. 2B can distinguish between State 2 and State 3, and the third Iref in FIG. 2C can distinguish between State 3 and State 4.

Figure 2D:
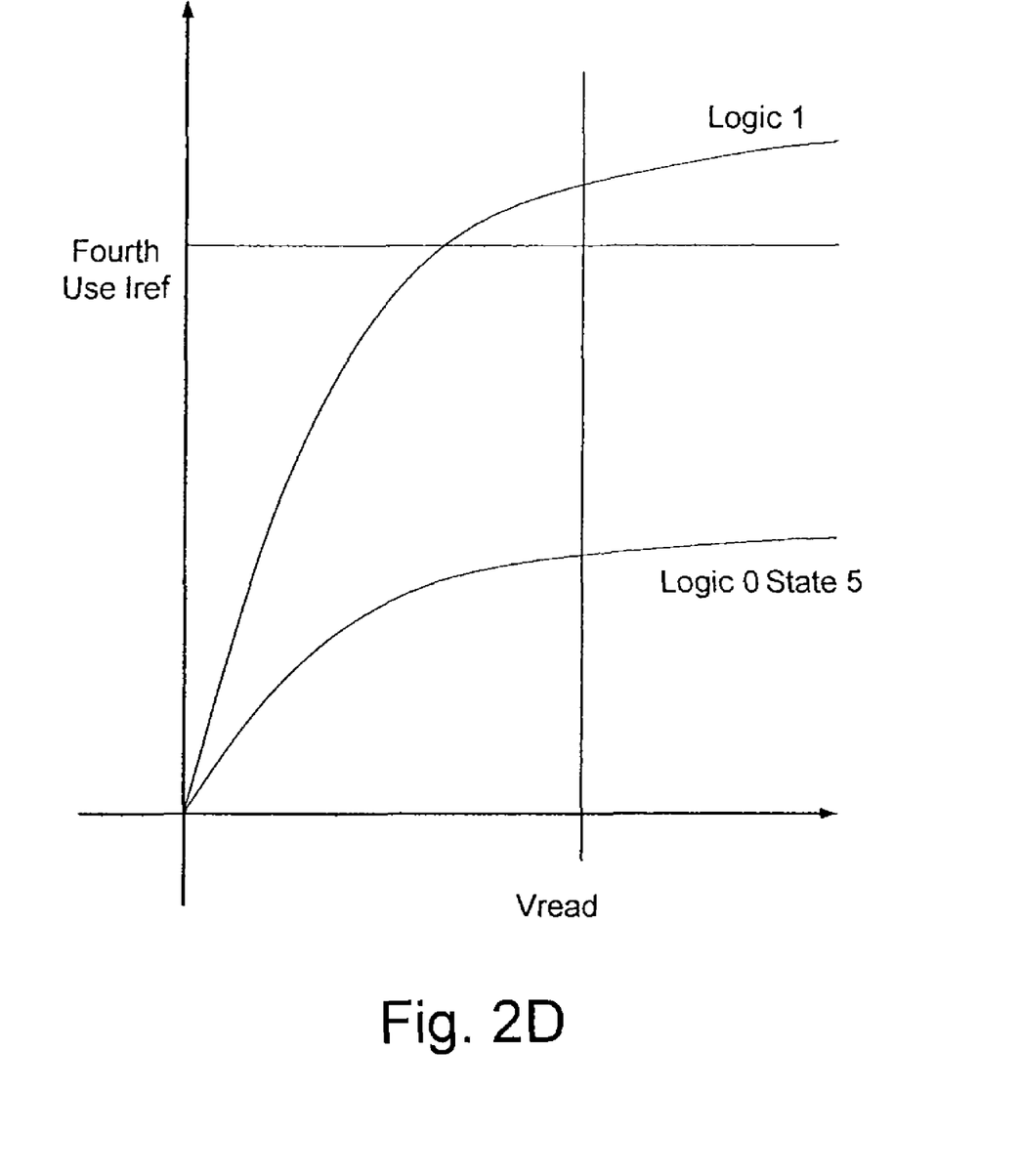

Instead of using all four states to represent two bits of data, pairs of the states can be used to represent one bit of data. This allows a multi-level cell that can store more than two states to mimic a re-writable single-bit (i.e., binary) memory cell. With reference to FIG. 2A, the first time the memory cell is programmed, State 1 represents a Logic 1, and State 2 represents a Logic 0, with States 3 and 4 not being applicable. The second time the memory cell is programmed, States 1 and 2 represent a Logic 1, and State 3 represents a Logic 0, with State 4 being not applicable (FIG. 2B). Similarly, the third time the memory cell is programmed, States 1, 2, and 3 represent a Logic 1, and State 4 represent a Logic 0 (FIG. 2C). Accordingly, by storing one-bit per memory cell at any given time, a four-state multi-level memory cell can be re-written with a single bit of data three times because it can store three different single bits of data at different times. Additionally, as shown in FIG. 2D, to obtain a fourth write to the memory cell, the memory device 100 can apply a stronger programming pulse to destroy a conductive path (e.g., "blow up" the diode contacts) of a memory cell to form an additional, higher resistivity level (State 5). In this alternative, State 5 would represent a Logic 0, and the higher state would represent a Logic 1.

Figure 3:
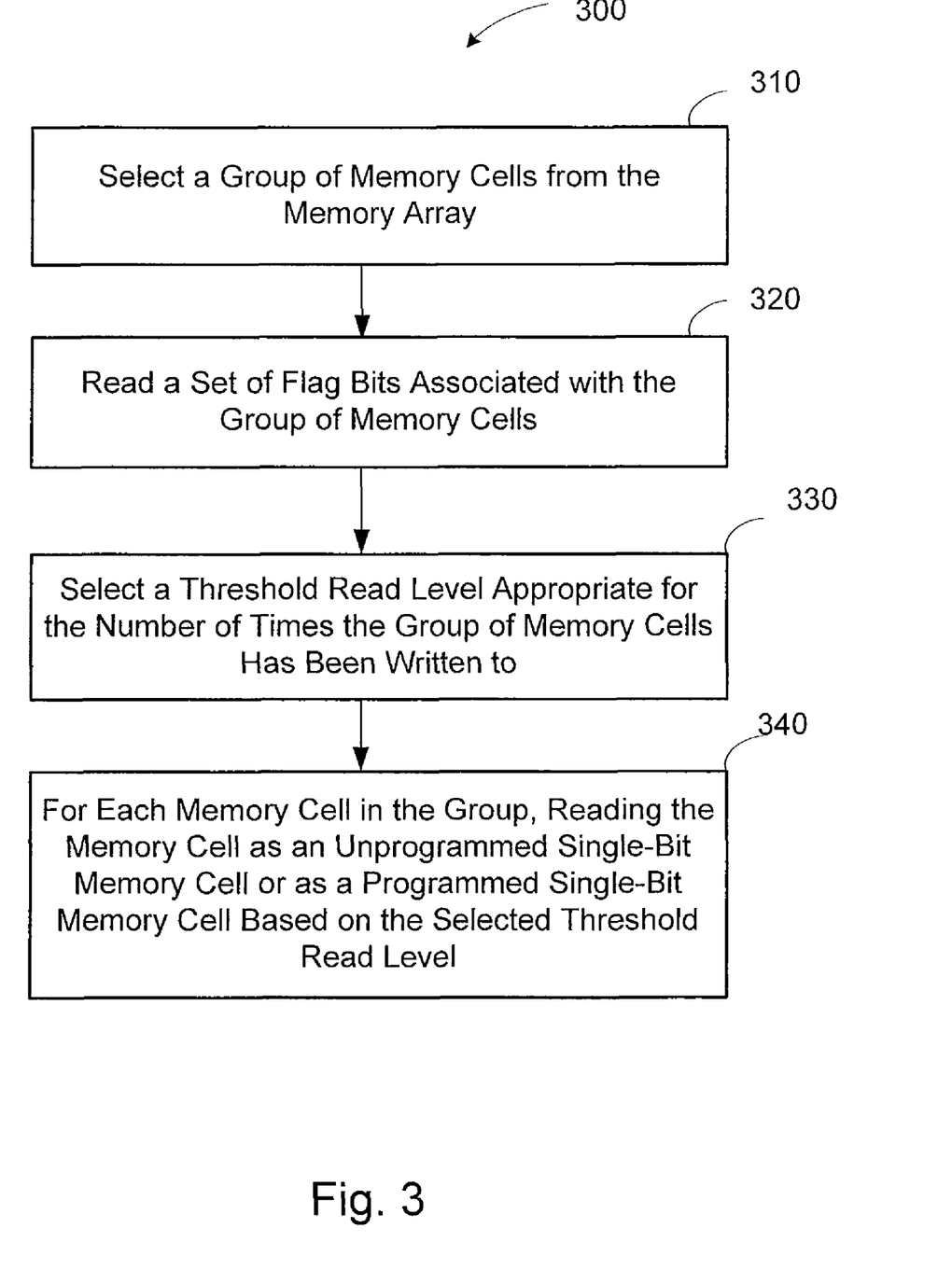
FIG. 3 is a flow chart of a method of an embodiment for reading data from a memory device with multi-level, write-once memory cells.

In order to keep track of how many writes have occurred and, thus, which threshold level to use, in one embodiment, a set (i.e., one or more) of flag bits is associated with a group of memory cells (e.g., a page of data) to indicate how many times the memory cells have been used. So that there is no uncertainty as to what threshold read level to use, the set of flag bits is preferably stored in binary memory cells that have only been written into once, as such cell are more robust against any manufacturing or circuit variation. FIG. 3 is a flowchart 300 of a method of an embodiment for reading memory cells using flag bits. As shown in FIG. 3, circuitry in the memory device 100 selects a group of memory cells (here, a page of data) from the memory array 130 (act 310). Next, a set of flag bits associated with the group of memory cells is read (act 320). Here, binary memory cells in a "sideband" area of the page are used to store the set of flag bits. The sideband area can also store other information, such as error correction code bits and pointers to spare blocks of memory, for example. As discussed above, the set of flag bits indicate a number of times the group of memory cells has been written to. The memory device 100 then selects a threshold read level (e.g., current or voltage) appropriate for the number of times the group of memory cells has been written to (act 330), and, for each memory cell in the group, the memory device 100 reads the memory cell as an unprogrammed single-bit memory cell or as a programmed single-bit memory cell based on the selected threshold read level (act 340).

For a program operation, after a group of memory cells has been programmed, a second set of flag bits is programmed to indicate an increase in the number of times the group of memory cells has been written to (using, for example, the data and flag bit control circuitry 180 in FIG. 1). As discussed above, using a different set of flag bits instead of re-programming the original set of flag bits may be preferred to ensure the robustness of this information. However, in other embodiments, the re-writabilty techniques described herein can be used to reprogram the original set of flag bits. Also, to improve performance, a group of memory cells can be read before programming, so that only those memory cells needing an adjustment in resistance are programmed.

These embodiments provide several advantages. Write-once memory cells, such as anti-fuse memory cells in a three-dimensional memory matrix, are low cost, but the data contained in such cells cannot be updated. These embodiments still provide a low-cost binary memory cell, but these embodiments provide the advantage of rewritability. Also, these embodiments allow a single read cycle to be used even though multiple levels are used in any given read operation. This maintains high performance. Further, these embodiments allow a direct over-write operation and do not requite an erase operation, as is needed in NAND Flash rewritable cells. Additionally, only one logic state at the time requires programming, as the one can always be skipped during programming. This also provided good performance.

Figure 4:
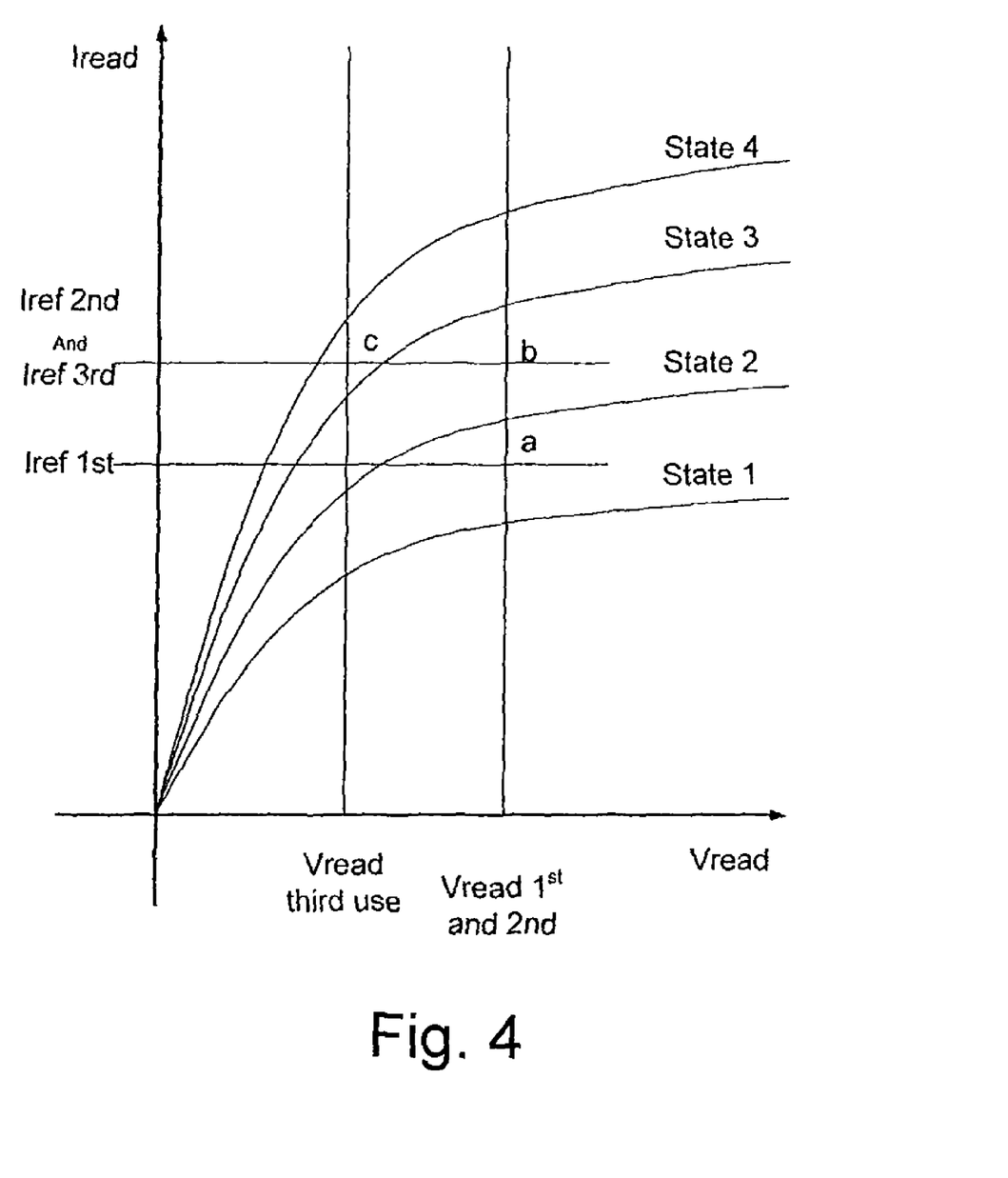
FIG. 4 is a graph of current versus voltage curves of a memory cell of an embodiment.

There are several alternatives that can be used with these embodiments. For example, instead of using the same Vread value and changing the Iref value to detect different states, a different Vread value can be used for certain states. This alternative is shown in the graph of FIG. 4. As shown in this graph, in the second and third uses, the memory device 100 keeps the same Iref but changes Vread. The advantage of this approach is that a sense amp in the sensing circuitry 170 may be designed to provide the biggest gain and the highest accuracy at a certain power level (i.e., at a certain I ref). So, if the memory device 100 uses too low of an Iref, the sensing circuitry 170 may not operate optimally.

In another alternative, the controller 120 can perform wear leveling to make the memory device 100 seem like more than three-times rewritable. In operation, after three uses, a page of data can be marked as bad, and other pages can be used for the new data. In yet another alternative, the multiple use of the memory cells can provide higher read endurance (even higher than traditional one-time-programmable cells) rather than multiple write uses. When read endurance problems are detected by on-chip error correction code (ECC) algorithms, the memory device 100 can perform read, correct, and rewrite operation in the same location to provide strong read margins. The original Logic 1 is still the high resistance level and is not programmed, but the reference level is raised so reading Logic 1 has more margin. Logic 0 can be programmed to a lower resistance level with a good margin.

Also, while the examples presented above show three levels in monotonically decreasing resistance that are twice writable, additional levels can be used (e.g., five levels in monotonically decreasing resistance can be four times writable, etc.) Additionally, while "Logic 0" and "Logic 1" were used to describe various states in the above examples, it should be understood that opposite logic values can be assigned and that "Logic 0" and "Logic 1" can even be changed from use to use based on the set of flag bits.

Lastly, it should be noted than any suitable memory cell can be used. The following patent documents, which are hereby incorporated by reference, are examples of some suitable memory cells: U.S. Pat. No. 6,490,218, U.S. Patent Application Publication No. 2007/0090425, and U.S. Patent Application Publication No. 2009/0086521. It should be noted that these are merely examples, and a particular type of memory cell should not be read into the claims.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A memory device comprising:
 a memory array comprising a plurality of multi-level write-once memory cells, wherein each memory cell is programmable to one of a plurality of resistivity levels;
 circuitry in communication with the memory array, wherein the circuitry is configured to:
  select a group of memory cells from the memory array;
  read a set of flag bits associated with the group of memory cells, wherein the set of flag bits indicate a number of times the group of memory cells has been written to;
  select a threshold read level appropriate for the number of times the group of memory cells has been written to; and
  for each memory cell in the group of memory cells, read the memory cell as an unprogrammed single-bit memory cell or as a programmed single-bit memory cell based on the selected threshold read level.

2. The memory device of claim 1, wherein the circuitry is further configured to:
 program the group of memory cells; and
 program a second set of flag bits to indicate an increase in the number of times the group of memory cells has been written to.

3. The memory device of claim 2, wherein the group of memory cells are read before programming and only those memory cells needing an adjustment in resistance are programmed.

4. The memory device of claim 1, wherein the threshold read level comprises a voltage level.

5. The memory device of claim 1, wherein the threshold read level comprises a current level.

6. The memory device of claim 1, wherein memory cells that store the set of flag bits have only been written into once.

7. The memory device of claim 1, wherein the circuitry is further operative to apply a pulse to destroy a conductive path of a memory cell to form an additional, higher resistivity level.

8. A method for reading multi-level write-once memory cells, the method comprising:
 selecting a group of memory cells from a memory array comprising a plurality of multi-level write-once memory cells, wherein each memory cell is programmable to one of a plurality of resistivity levels;
 reading a set of flag bits associated with the group of memory cells, wherein the set of flag bits indicate a number of times the group of memory cells has been written to;
 selecting a threshold read level appropriate for the number of times the group of memory cells has been written to; and
 for each memory cell in the group of memory cells, reading the memory cell as an unprogrammed single-bit memory cell or as a programmed single-bit memory cell based on the selected threshold read level.

9. The method of claim 8 further comprising:
 programming the group of memory cells; and
 programming a second set of flag bits to indicate an increase in the number of times the group of memory cells has been written to.

10. The method of claim 9, wherein the group of memory cells are read before programming and only those memory cells needing an adjustment in resistance are programmed.

11. The method of claim 8, wherein the threshold read level comprises a voltage level.

12. The method of claim 8, wherein the threshold read level comprises a current level.

13. The method of claim 8, wherein memory cells that store the set of flag bits have only been written into once.

14. The method of claim 8 further comprising applying a pulse to destroy a conductive path of a memory cell to form an additional, higher resistivity level.

* * * * *